US007065303B1

(12) United States Patent
Kerem

(10) Patent No.: US 7,065,303 B1
(45) Date of Patent: Jun. 20, 2006

(54) EFFICIENT LOW POWER OPTICAL SOURCE DRIVER AND METHOD AND OPTICAL SYSTEMS AND DEVICES USING SAME

(75) Inventor: Samuel Kerem, Rockville, MD (US)

(73) Assignee: Corvis Corporation, Columbia, MD (US)

( * ) Notice: Subject to any disclaimer, the term of this patent is extended or adjusted under 35 U.S.C. 154(b) by 757 days.

(21) Appl. No.: 10/079,710

(22) Filed: Feb. 20, 2002

(51) Int. Cl.
*H04B 10/04* (2006.01)

(52) U.S. Cl. .................... 398/197; 398/182; 398/183; 398/186; 398/192; 398/193; 398/194; 398/195; 372/38; 372/34; 372/32; 372/29; 372/33; 372/43; 372/44; 361/18; 315/291; 331/94.5

(58) Field of Classification Search ................ 372/38, 372/29, 26, 32, 34, 33, 44, 43; 361/18; 315/291; 331/94.5; 398/182, 183, 186, 192, 193, 194, 398/195, 197
See application file for complete search history.

(56) References Cited

U.S. PATENT DOCUMENTS 4,639,924 A * 1/1987 Tsunekawa ................. 372/33
5,463,648 A * 10/1995 Gibbs ....................... 372/38.02

OTHER PUBLICATIONS

Kenyon, Kevin, "Visible-Laser Driver Has Digitally Controlled Power and Modulation", Electronic Design, Mar. 23rd 1998, p. 132.

IC-VJ, IC-VJZ Laser Diode Controller Data Sheet by IC-Haus Corporation.
Williams, Jim, Current Sources for Fiber-Optic Lasers: A Compendium of Pleasant Current Events, Aug. 22, 2002, pp. 69-78, EDN.

* cited by examiner

*Primary Examiner*—Hanh Phan

(57) ABSTRACT

Systems, apparatuses, and methods for driving an optical source with a current source. The optical source driver has a primary control loop having a DC—DC converter and an operational amplifier, wherein the DC—DC converter has a power input, a power output connected to the input of the optical source, and a control input, and wherein the operational amplifier has a first input connected between the optical source and the current source, a second input, and an output connected to the control input of the DC—DC converter, for controlling the output of the DC—DC converter in response to a control signal at the second input. In addition, the optical source drive includes an override control loop having a power input, a power output connected to an input of the optical source, a switch between the power input and the power output, and a comparator having a first input connected between the optical source and the current source, having a second input, and having an output connected to a control input of the switch, for selectively connecting the power input to the power output when a signal between the optical source and the current source falls below a predetermined point.

8 Claims, 6 Drawing Sheets

EFFICIENT LOW POWER OPTICAL SOURCE DRIVER AND METHOD AND OPTICAL SYSTEMS AND DEVICES USING SAME

CROSS-REFERENCE TO RELATED APPLICATIONS

Not Applicable.

STATEMENT REGARDING FEDERALLY SPONSORED RESEARCH OR DEVELOPMENT

Not Applicable.

BACKGROUND OF THE INVENTION

The present invention is directed generally to the transmission of signals in optical communications systems. More particularly, the invention relates to systems, devices, and methods for an efficient low power optical source driver.

The development of digital technology provides the ability to store and process vast amounts of information. While this development greatly increased information processing capabilities, it was soon recognized that in order to make effective use of information resources it was necessary to interconnect and allow communication between information resources. Efficient access to information resources requires the continued development of information transmission systems to facilitate the sharing of information between resources. One effort to achieve higher transmission capacities has focused on the development of optical transmission systems. Optical transmission systems can provide high capacity, low cost, low error rate transmission of information over long distances.

The transmission of information over optical systems is typically performed by imparting the information in some manner onto an optical carrier by varying characteristics of the optical carrier. In most optical transmission systems, the information is imparted by using an information data stream to either directly or externally modulate an optical carrier so that the information is imparted at the carrier frequency or on one or more sidebands, with the later technique sometimes called upconversion or sub-carrier modulation ("SCM").

Initially, single wavelength carriers were spatially separated by placing each carrier on a different fiber to provide space division multiplexing ("SDM") of the information in optical systems. As the demand for capacity grew, increasing numbers of information data streams were spaced in time, or time division multiplexed ("TDM"), on the single wavelength carrier in the SDM system as a means to better use the available bandwidth. The continued growth in demand has spawned the use of multiple wavelength carriers on a single fiber using wavelength division multiplexing ("WDM"). In WDM systems, further increases in transmission capacity can be achieved not only by increasing the transmission rate of the information on each wavelength, but also by increasing the number of wavelengths, or channel count, in the system.

There are two general options for increasing the channel count in WDM systems. The first option is to widen the transmission bandwidth to add more channels at current channel spacings. The second option is to decrease the spacing between the channels to provide a greater number of channels within a given transmission bandwidth. The first option currently provides only limited benefit, because most optical systems use erbium doped fiber amplifiers ("EDFAs") to amplify the optical signal during transmission. EDFAs have a limited bandwidth of operation and suffer from non-linear amplifier characteristics within the bandwidth. Difficulties with the second option include controlling optical sources that are closely spaced to prevent interference from wavelength drift and nonlinear interactions between the signals.

WDM optical communication systems require a large number of optical sources. EDFA and Raman optical amplifiers, optical transmitters, and optical interface devices all require optical sources. The increasing demand for bandwidth requires an increased number of optical channels or optical wavelengths, which in turn increases the number of optical sources in the system. Additionally, the optical amplifiers require an increased number of optical sources to amplify the large number of optical channels effectively. Greater transmission distances also increase the number optical amplifiers required, and hence the number optical sources.

The optical sources typically used in optical communication systems exhibit variations in electrical characteristics from device to device. Also, the electrical characteristics of a device changes over time and operating conditions. In driving these various optical sources, the power supply provides power to accommodate the worst-case device characteristics. This leads to excess power dissipated as heat in resistive loads. While the excess power supplied to one optical source may not be significant, the excess power supplied to hundreds or thousands of optical sources becomes a problem. Generating this excess power increases system cost, weight, volume, and complexity. In addition, the excess heat must be dissipated increasing the need for additional heat sinks and cooling systems that increases system cost, weight, volume, and complexity.

Increasing the number of wavelength channels in WDM systems and the transmission bit rate have increased the power and cooling required to drive the greater number of optical source drivers. Therefore, a need exists for improved techniques and systems that provide more efficient, lower power optical source drivers in today's high capacity and long distance optical communication systems.

BRIEF SUMMARY OF THE INVENTION

The systems, devices, and methods of the present invention address the above-stated need for more efficient low power optical source drivers. The present invention can be employed with a variety of optical sources, for example sliced spectrum sources, fiber lasers, semiconductor lasers, and light emitting diodes, that are employed in a variety of applications, for example optical transmitters, interfacial devices, and optical amplifiers.

One embodiment of the present invention includes systems, apparatuses, and methods for driving an optical source. The optical source driver has a primary control loop having a DC—DC converter and an operational amplifier, wherein the DC—DC converter has a power input, a power output connected to the input of the optical source, and a control input, and wherein the operational amplifier has a first input connected between the optical source and the current source, a second input, and an output connected to the control input of the DC—DC converter, for controlling the output of the DC—DC converter in response to a control signal at the second input. In addition, the optical source driver includes an override control loop having a power input, a power output connected to an input of the optical source, a switch between the power input and the power output, and a comparator having a first input connected between the optical source and the current source, having a second input, and having an output connected to a control input of the switch, for selectively connecting the power input to the power output when a signal between the optical source and the current source falls below a predetermined point.

Another embodiment of the present invention includes systems, apparatuses, and methods for driving an optical source. The optical source driver includes a current source having an input connected to an output of the optical source. In addition, the optical source driver includes a primary control loop having a DC—DC converter, an overhead controller, and an operational amplifier, wherein the DC—DC converter has a power input, a power output connected to the input of the optical source, and a control input, and wherein the overhead controller has an output and an input, and wherein the operational amplifier has a first input connected between the optical source and the current source, a second input connected to the overhead controller output, and an output connected to the control input of the DC—DC converter, for controlling the output of the DC—DC converter in response to a control signal at the input of the overhead controller.

Those and other embodiments of the present invention will be described in the following detailed description. The present invention addresses the needs described above in the description of the background of the invention by providing improved systems, apparatuses, and methods. These advantages and others will become apparent from the following detailed description.

BRIEF DESCRIPTION OF THE DRAWINGS

Embodiments of the present invention will now be described, by way of example only, with reference to the accompanying drawings, wherein.

DETAILED DESCRIPTION OF THE INVENTION

Figure 1:
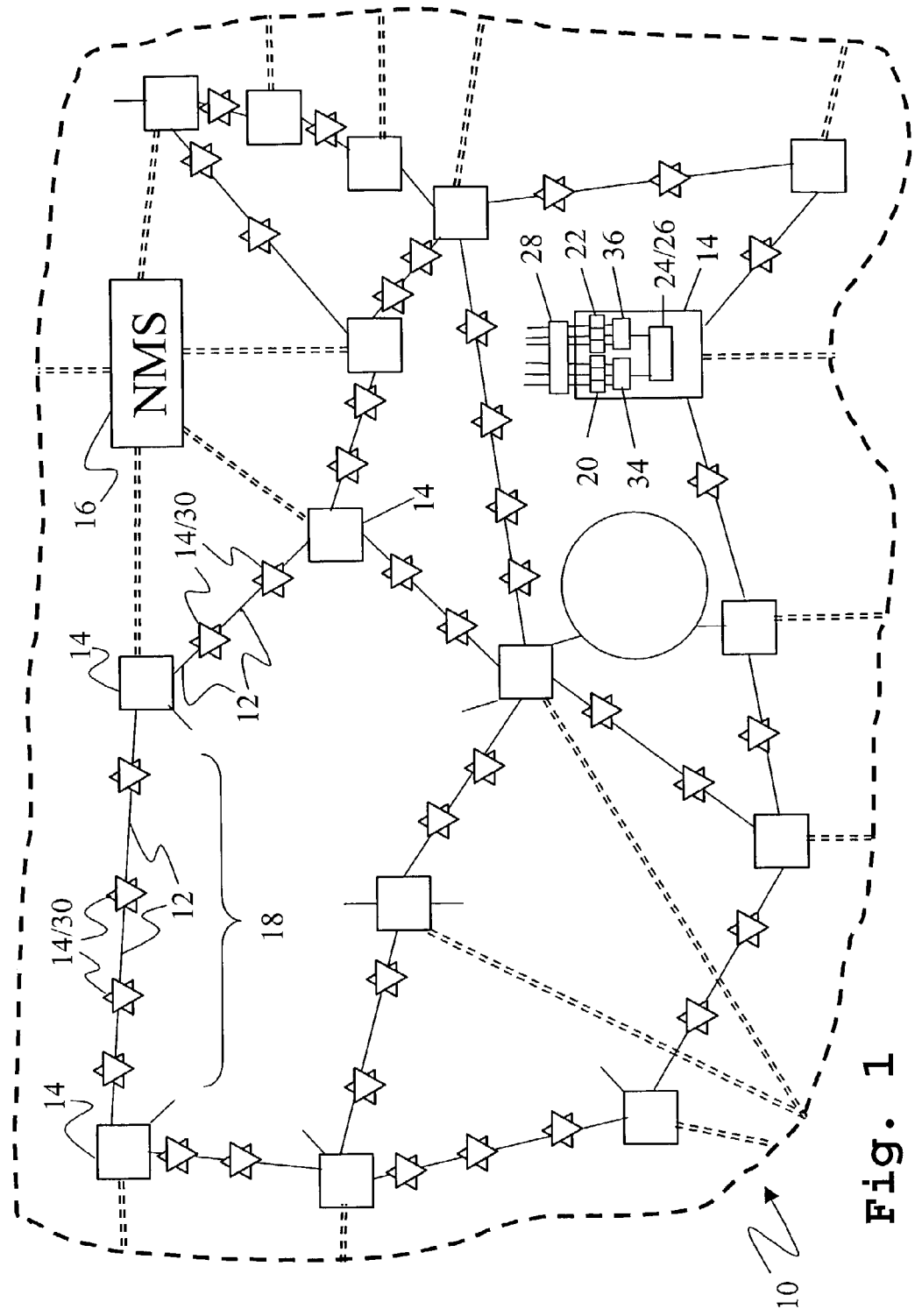
FIGS. 1 and 2 show examples optical communications systems.

FIG. 1 shows an optical communications system 10 that includes optical paths 12 connecting network nodes and elements 14. The optical communication system 10 can be realized with many system configurations and architectures, such as an all optical network, one or more point to point links, one or more rings, a mesh, other architectures, or combinations of architectures. The system 10 illustrated in FIG. 1 is a multi-dimensional network, which can be implemented, for example, as an all optical mesh network, as a collection of point to point links, or as a combination of architectures. The system 10 can employ various transmission schemes, such as space, time, code, frequency, phase, polarization, and/or wavelength division multiplexing, and other types and combinations of multiplexing schemes. The system 10 can also include more or less features than those illustrated herein, such as by including a network management system ("NMS") 16 and changing the number, location, content, configuration, and connection of network nodes and elements 14.

The optical paths 12 can include guided and unguided paths or waveguides, such as one or more optical fibers, ribbon fibers, planar devices, and free space devices, and can interconnect the network nodes and elements 14 establishing links 18 and providing optical communication paths through the system 10. The optical paths 12 can carry one or more uni- or bi-directionally propagating optical signal channels or wavelengths. The optical signal channels can be treated individually or as a single group, or they can be organized into two or more wavebands or spectral groups, each containing one or more optical signal channels.

The network nodes and elements 14 can include one or more signal processing devices including one or more of various optical and/or electrical components. The network nodes and elements 14 can perform network functions or processes, such as switching, routing, amplifying, multiplexing, combining, demultiplexing, distributing, or otherwise processing optical signals. For example, network nodes and elements 14 can include one or more transmitters 20, receivers 22, switches 24, add/drop multiplexers 26, amplifiers 30, interfacial devices 28, multiplexers/combiners 34, and demultiplexers/distributors 36, as well as filters, dispersion compensating and shifting devices, monitors, couplers, splitters, and other devices. One embodiment of one network node 14 is illustrated in FIG. 1, although many other variations and embodiments of network nodes and elements 14 are contemplated.

The NMS 16 can manage, configure, monitor, and control network nodes and elements 14 and can include multiple management layers that can be directly and indirectly connected to the network nodes and elements 14. The NMS 16 can be directly connected to some network nodes and elements 14 via a data communication network (shown in broken lines) and indirectly connected to other network nodes and elements 14 via a directly connected network node and the optical system 10.

The optical transmitters 20 and receivers 22 are configured respectively to transmit and receive optical signals including one or more information carrying optical signal wavelengths, or channels, via the optical paths 12. The transmitters 20 include an optical source that provides an optical carrier and can utilize, for example, coherent or incoherent sources, and narrow band or broad band sources, such as sliced spectrum sources, fiber lasers, semiconductor lasers, light emitting diodes, and other optical sources. The transmitters 20 often include a narrow bandwidth optical source as the optical source. The optical transmitter 20 can impart information to the optical source by directly modulating the optical source or by externally modulating the optical source. Alternatively, the information can be imparted to an electrical carrier that can be upconverted onto an optical wavelength to produce the optical signal.

Similarly, the optical receiver 22 can include various detection techniques, such as coherent detection, optical filtering, and direct detection. Tunable transmitters 20 and receivers 22 can be used to provide flexibility in the selection of wavelengths used in the system 10.

The switches 24 can take many forms and can have different levels of "granularity". "Granularity" refers to the resolution or precision with which the switching is performed. Switches can have electrical, optical, or electrical/optical switch "fabrics". The switch "fabric" describes the domain and/or manner in which the signal switching occurs. There are many types of optical switch fabrics, for example, micro-electromechanical systems ("MEMS"), variable index of refraction devices, or optical gain and/or loss control of an optical path.

Interfacial devices 28 optically separate and act as interfaces to and between optical networks 10 and/or point to point links 18. Interfacial devices 28 perform at least one optical to electrical or electrical to optical conversion before passing signals into or out of the link 18 or network 10. Interfacial devices 28 include optical sources to perform electrical to optical conversion. Interfacial device 28 can be located within or at the periphery of networks 10, such as between two or more networks 10, between two or more point to point links 18, and between networks 10 and point to point links 18. Interfacial devices 28 include, for example, cross-connect switches, IP routers, ATM switches, etc., and can have electrical, optical, or a combination of switch fabrics. Interfacial devices 28 can provide interface flexibility and can be configured to receive, convert, and provide information in one or more various protocols, encoding schemes, and bit rates to the transmitters 20, receivers 22, and other devices. The interfacial devices 28 also can be used to provide other functions, such as protection switching.

The optical amplifiers 30 can be used to provide signal gain and can be deployed proximate to other optical components, such as in network nodes and elements 14, as well as along the optical communications paths 12. The optical amplifiers 30 can include concentrated/lumped amplification and/or distributed amplification, and can include one or more stages. The optical amplifier can include doped (e.g. erbium, neodymium, praseodymium, ytterbium, other rare earth elements, and mixtures thereof) and Raman fiber amplifiers that can be locally or remotely pumped with optical energy from an optical source. The optical amplifiers 30 can also include other types of amplifiers 30, such as semiconductor amplifiers.

Optical combiners 34 can be used to combine the multiple signal channels into WDM optical signals for the transmitters 20. Likewise, optical distributors 36 can be provided to distribute the optical signal to the receivers 22. The optical combiners 34 and distributors 36 can include various multi-port devices, such as wavelength selective and non-selective ("passive") devices, fiber and free space devices, and polarization sensitive devices. Other examples of multi-port devices include circulators, passive, WDM, and polarization couplers/splitters, dichroic devices, prisms, diffraction gratings, arrayed waveguides, etc.

Figure 2:
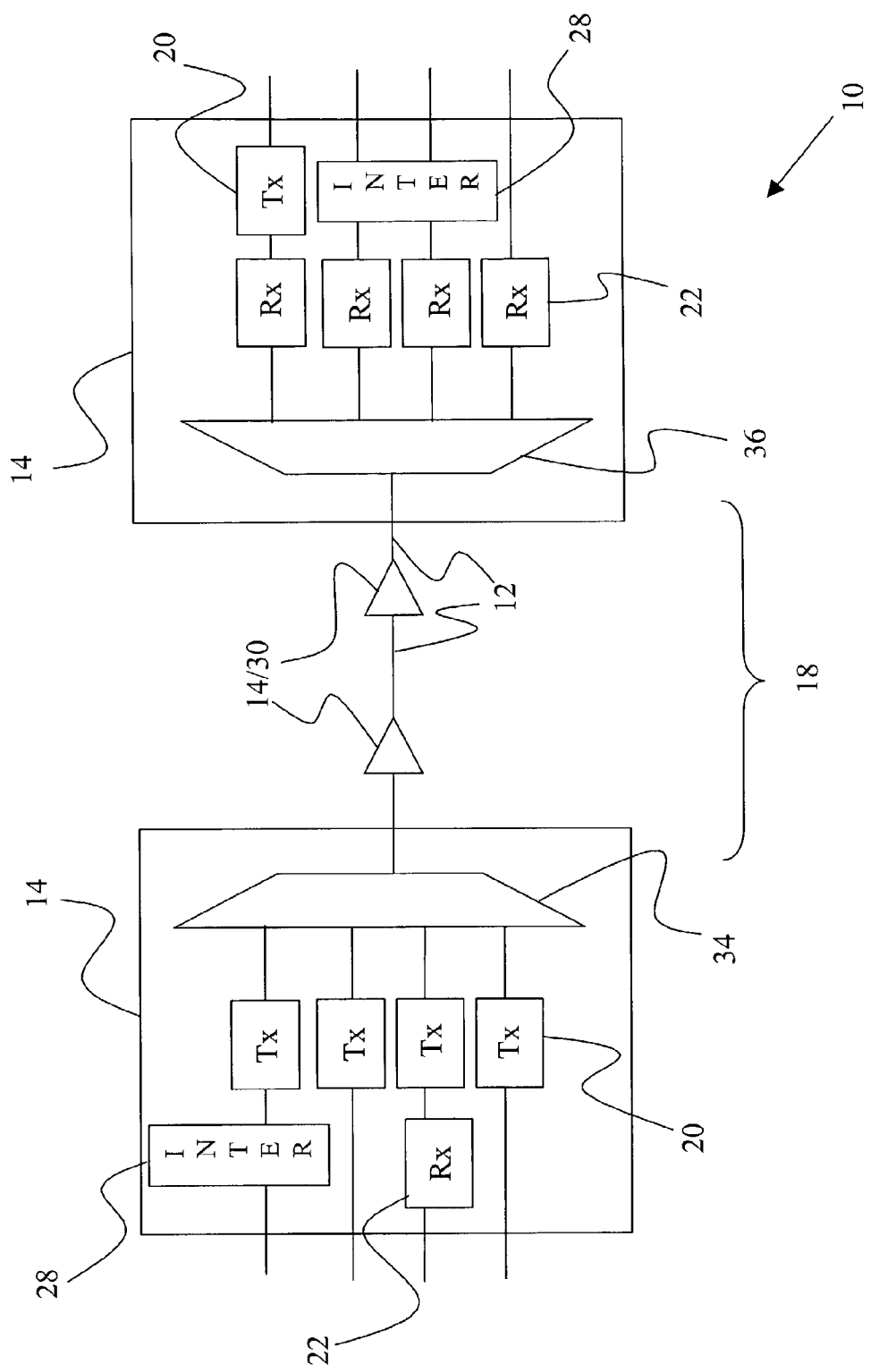

FIG. 2 shows another embodiment of the system 10 including a link 18 of four network nodes and elements 14. That system 10 can, for example, be all or part of a point to point system 10, or it may be part of a multi-dimensional, mesh, or other system 10.

Figure 3:
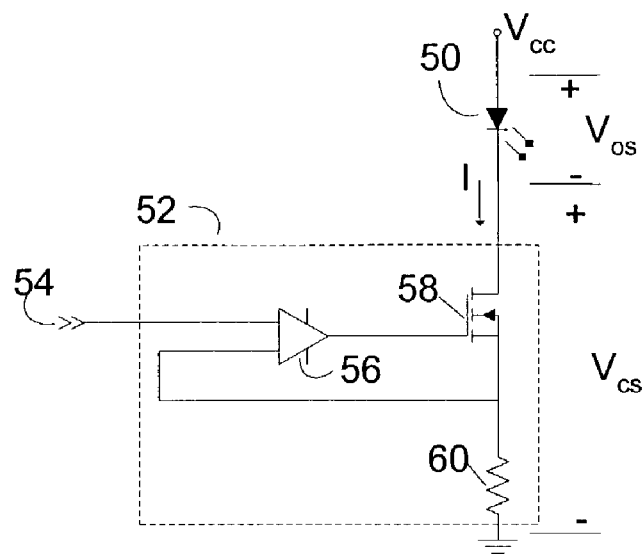
FIG. 3 shows a prior art optical source driver.

FIG. 3 shows an optical source 50 driven by a current source 52 as is found in the prior art. The optical source 50 can be, for example, a laser diode, an LED, or other optical sources 50. The current source 52 provides a current to drive the optical source 50 based upon an input control signal 54. The control signal is indicative of the desired optical output power from the optical source 50. This control signal 54 may come, for example, from the NMS 16 (FIG. 1).

The current source 52 has an operational amplifier 56 controlling the gate of a transistor 58, a current sensor 60 connected to the transistor that measures the current through the optical source 50 and transistor 58, and a fixed supply voltage $V_{cc}$ applied across the optical source 50 and current source 52. When the current source 52 generates a current I, it causes a voltage drop $V_{os}$ across the optical source 50. As the current I increases or decreases, the optical source voltage $V_{os}$ increases or decreases accordingly. Similarly, the voltage VCS across the current source 52 is related to the current I and the optical source voltage $V_{os}$, such that $V_{cs}=V_{cc}-V_{os}$. Therefore, the current source voltage $V_{cs}$ also varies as a function of current, i.e., as current increases, $V_{cs}$ decreases (because $V_{os}$ increases), and as current decreases, $V_{cs}$ increases (because $V_{os}$ decreases). The current source 52 requires a minimum voltage $V_{min}$ in order to operate. Any voltage drop across the current source in excess of the minimum voltage $V_{min}$ is excess power that is dissipated as heat. The power dissipated is $(V_{cs}-V_{min})$. I, If the current source voltage $V_{cs}$ is less than $V_{min}$, the current source 52 will not operate.

Figure 4:
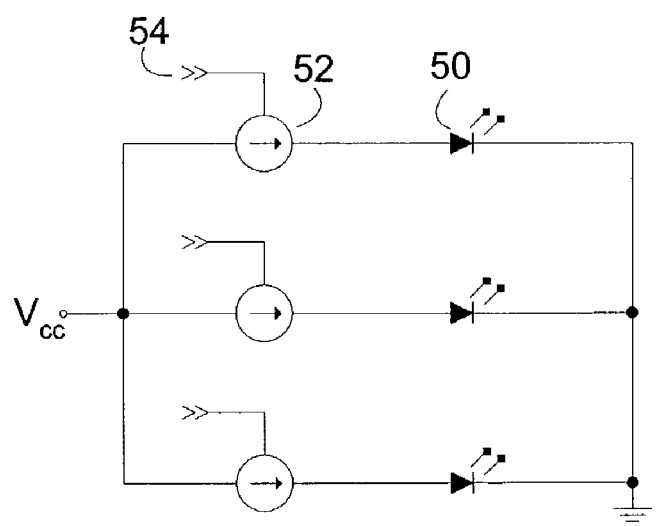
FIG. 4 shows a prior art optical source driver with multiple optical sources.

FIG. 4 shows a number of optical sources 50 as might be found, for example, in an optical transmitter 20 or optical amplifier 30. The optical sources 50 are driven by corresponding current sources 52. $V_{cc}$ again is the power supply voltage applied across the optical sources 50 and current sources 52. $V_{cc}$ is selected to accommodate the maximum voltage $V_{max}$ required to drive the optical sources 50, plus the minimum voltage $V_{min}$ for the current source 52, plus an overhead voltage $V_{oh}$. The overhead voltage $V_{oh}$ provides a voltage margin to prevent the current source voltage $V_{cs}$ from falling below the minimum voltage $V_{min}$, which would shut down the current source.

The voltage versus current profile for optical sources 50 vary from device to device. Therefore, the maximum voltage $V_{max}$ for optical sources 50 can vary significantly from device to device and can vary over time and operating conditions for individual optical sources 50. For example, the maximum voltage $V_{max}$ can typically be between 1.7V to 2.8V for laser diodes. In FIG. 4 for example, $V_{cc}$ can be set to accommodate a maximum voltage $V_{max}$ of 2.8V. If one of the optical sources 50 only has a maximum voltage $V_{max}$ of 1.7V, the additional 1.1V must be dissipated across the current supply 52 as wasted power in the form of heat. Further, additional power may be required to provide cooling to remove the excess heat. When many optical sources are in an optical communication system, the wasted power can become significant. Therefore, a need remains for systems, devices, and methods for driving optical sources that minimize the power consumed.

Figure 5:
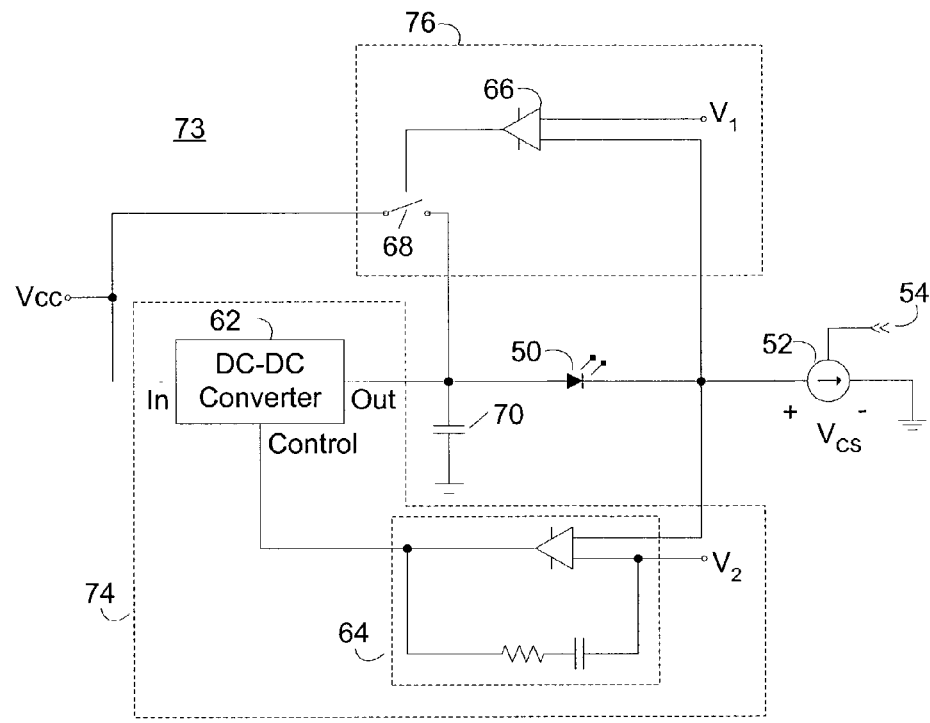
FIG. 5 shows an embodiment of the optical source driver of the present invention.

FIG. 5 illustrates an embodiment of an optical source driver 73 according to the present invention. The optical source driver 73 minimizes excess voltage drop across the current source 52, resulting in increased power efficiency. The optical source driver 73 includes a current source 52, a storage capacitor 70, a primary control loop 74, and a override control loop 76. The current source 52 can be the same as that described above or any other type of current source known in the art. The primary control loop 74 adjusts the current source voltage $V_{cs}$ to reduce excessive overhead voltage $V_{oh}$ and, thereby, to increase power efficiency. The override control loop 76 can react to changes more quickly, but it is less power efficient than the primary control loop 74. When the voltage required to drive the optical source $V_{os}$, changes rapidly, the override control loop 76 temporarily drives the optical source 50 until the primary loop has compensated for the change in $V_{os}$. The storage capacitor 70 stores energy that can also be used to help drive the optical source when $V_{os}$ changes rapidly.

The primary control loop 74 in the illustrated embodiment includes a DC—DC converter 62 and an operational amplifier 64. The DC—DC converter 62 converts an input DC voltage level, $V_{cc}$ in this case, to a different output DC voltage level $V_{out}$. DC—DC converters 62 are very efficient and can have efficiencies exceeding 95%. The DC—DC converter 62 has an input control voltage $V_{con}$ that controls the output voltage $V_{out}$. The operational amplifier 64 produces the control voltage $V_{con}$ for controlling the output voltage $V_{out}$ of the DC—DC converter. The operational amplifier 64 compares the voltage drop across the current source 52, $V_{cs}$, to a second voltage $V_2$. The second voltage $V_2$ can be set to be equal to or greater than the minimum voltage $V_{min}$ required to drive the current source plus the overhead voltage $V_{oh}$. As a result of this closed loop control, the DC—DC converter 62 produces an output voltage resulting in a voltage drop of $V_2$ across the current source, even as the voltage across the optical source 50 varies. Therefore, $V_{oh}$ can be reduced and/or held constant, and thereby, the excess power dissipated by the current source, $V_{oh}$. I, is reduced.

The override control loop 76 has a quicker response time than the primary control loop 74 and allows the driver 73 to respond to large and fast voltage variations, but the override control loop 76 typically is less power efficient than the primary control loop 74. Therefore, when the voltage changes rapidly, the override control loop 76 activates to temporarily provide the needed voltage to the optical source 50. The override control loop 76 includes a comparator 66 and a switch 68. The comparator 66 compares the current source voltage $V_{cs}$ to a first voltage $V_1$ that is less than the second voltage $V_2$ but not less than the minimum voltage $V_{min}$. When the current source voltage $V_{cs}$ approaches the first voltage $V_1$, the current source 52 is nearing its cutoff voltage and is in danger of ceasing to operate. When the current source voltage $V_{cs}$ reaches the first voltage $V_1$, the comparator 66 actuates the switch 68 to provide additional power to the optical source 50. The switch 68 keeps the current source 52 and the optical source 50 operating. At the same time, the primary loop 74 adjusts the DC—DC converter to compensate for the change in operating conditions. When the voltage $V_{cs}$ exceeds $V_1$ again, the switch 68 will open and the primary control loop 74 will again control the power to the optical source 50 and current source 52.

The performance of the present invention can be modified to suit the needs of particular applications. For example, a typical response time of prior art current sources is about 4 μs, which is achievable with the present invention. A quicker response time is also possible, such as by utilizing faster components, which often consume more power. Likewise, greater power efficiency is possible if a slower response time is acceptable.

Figure 6A:
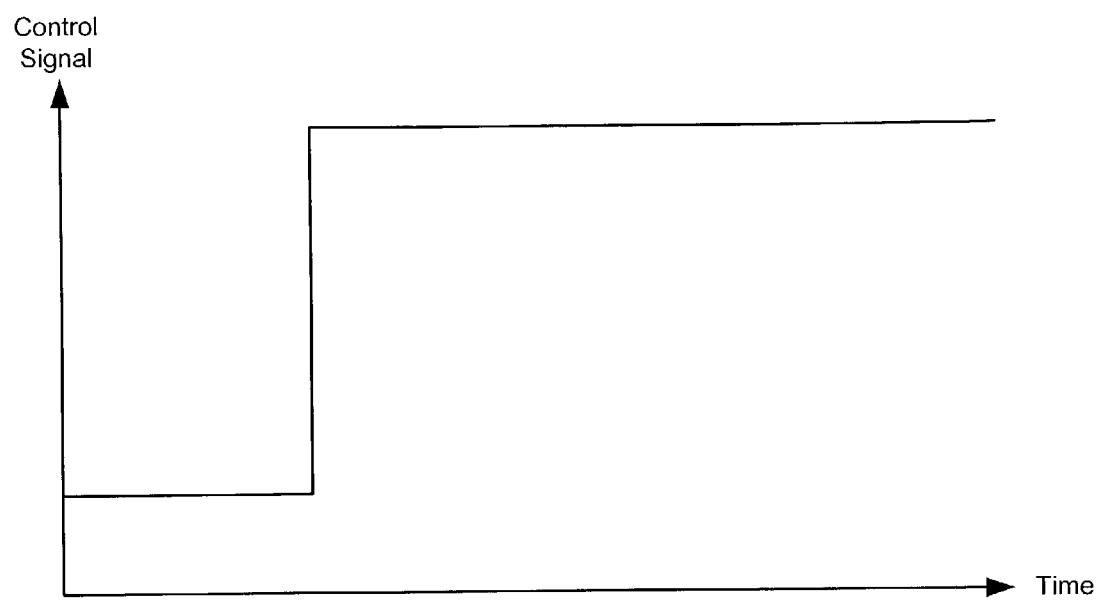
FIGS. 6A and 6B plot drive current and voltage drop versus time.
Figure 6B:
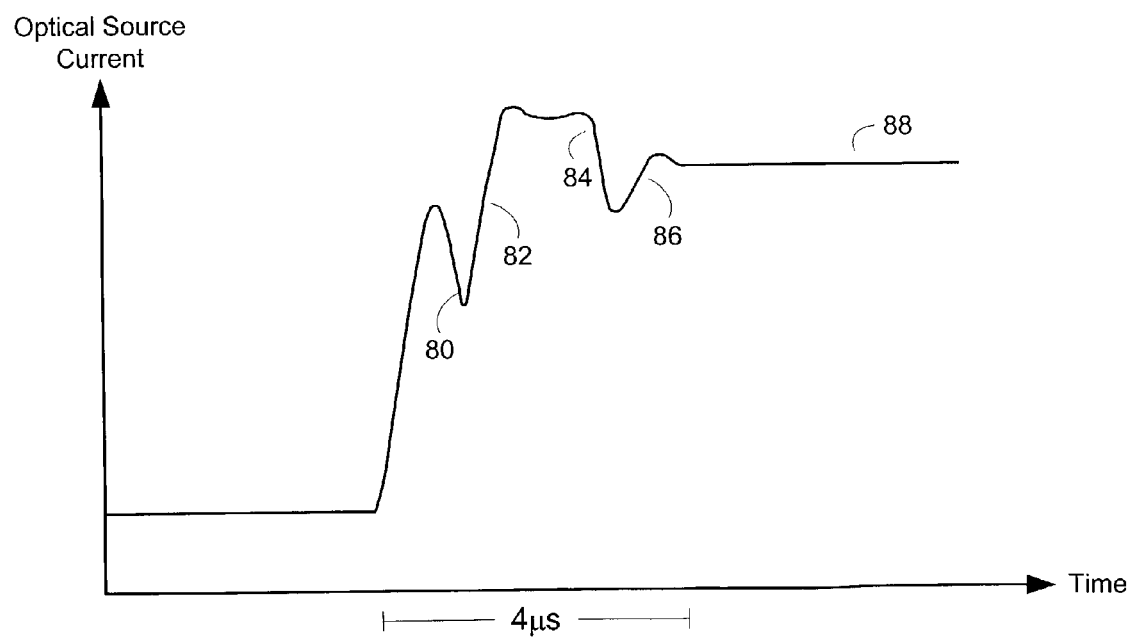

FIGS. 6A and 6B illustrate a typical transient response of the optical source driver 73 shown in FIG. 5 when the control signal 54 commands a new optical output power value. FIG. 6A shows a typical control signal stepping up from one value to another. FIG. 6B shows a typical resultant current flow through the optical source 50 in response to the change in the control signal 54. The current initially increases in response to the control signal change, but then it dips 80. The dip 80 occurs because the DC—DC converter cannot source enough current to drive the optical source 50 and the current source 52 at the new setting, and the excess voltage overhead and the energy stored in the capacitor 70 has been depleted. Near the bottom of the dip 80 the current source voltage $V_{cs}$ falls below $V_1$, the switch 68 actuates, and $V_{cc}$ drives the optical source 50 and current source 52. As a result, the optical source current and optical source voltage $V_{os}$ rises 82. When $V_{os}>V_1$, indicating that the circuit surrounding the optical source has stabilized and the primary loop 74 can resume controlling the driver 73, the switch 68 will open, as illustrated at 84. As the DC—DC converter resumes supplying voltage to the optical source 50 the optical source current dips and rises 86 and then settles into a steady state value 88. The oscillation at 86 is the typical settling seen in control circuits in response to a step input.

Figure 7:
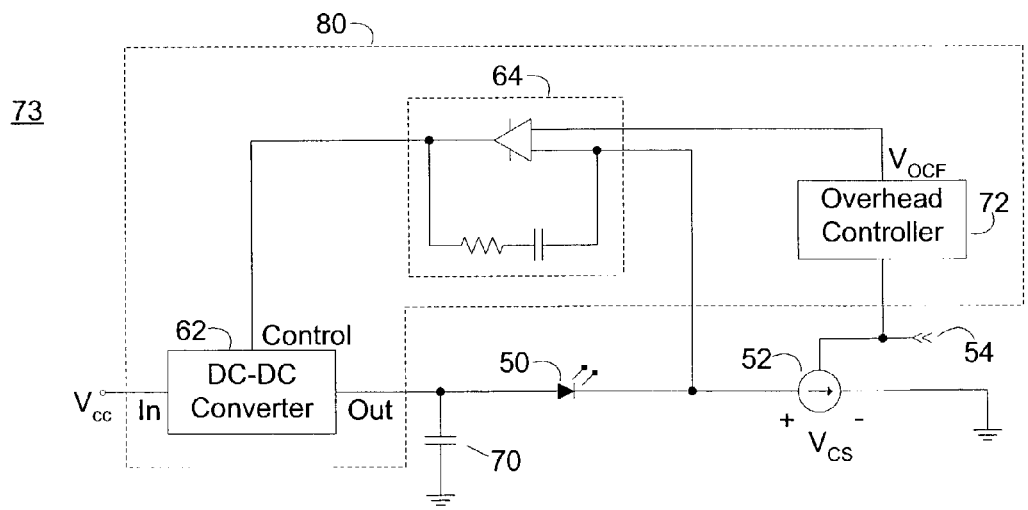
FIG. 7 shows another embodiment of the optical source drive of the present invention.

FIG. 7 is an embodiment of the present invention that provides reduced response time compared to the embodiment of FIG. 5, but is slightly less power efficient. The optical source driver 73 has an overhead control loop 80. The loop 80 is controlled by an overhead controller 72 that responds to the control signal 54 and that drives the DC—DC converter via an operational amplifier 64.

The operational amplifier 64 drives the DC—DC converter 62 to the desired voltage. The operational amplifier 64 compares the current source voltage $V_{cs}$ with a value $V_{OCF}$ (overhead control function voltage) provided by the overhead controller 72.

The overhead controller 72 varies $V_{OCF}$ inversely as a function of the optical source drive current, i.e., as optical source drive current increases $V_{OCF}$ decreases and as optical source drive current decreases $V_{OCF}$ increases. Because $V_{oh}=V_{OCF}-V_{min}$, $V_{oh}$ also varies inversely to the optical source drive current. The overhead controller 72 allows the optical source drive current to follow the control signal more closely.

The overhead source controller 72 can be implemented in a microprocessor used to control the optical communication system. Alternatively, the overhead control function 72 can be implemented in discrete circuitry designed to produce the desired relationship between the drive current and the overhead voltage $V_{oh}$. The control signal 54 used to control the current source 52 also can be used to determine the value of $V_{OCF}$ in the microprocessor, which then outputs $V_{OCF}$ to the operational amplifier 64.

When the optical source drive current is low, a large increase in the optical source drive current is possible. Therefore a larger overhead voltage Voh is needed to allow the DC—DC converter 62 time to react to a large change in optical source drive current. As the optical source drive current increases, less and less overhead voltage is required to follow the optical source drive current because the potential increase in optical source drive current is less as the maximum optical source drive current is approached. Therefore, as the optical source drive current increases the overhead controller 72 decreases the overhead voltage. The actual relationship between the optical source drive current and the overhead voltage $V_{oh}$ depends on the particular application and on factors such as the speed of DC—DC converter 62 and the storage capacity of the capacitor 70.

Figure 8:
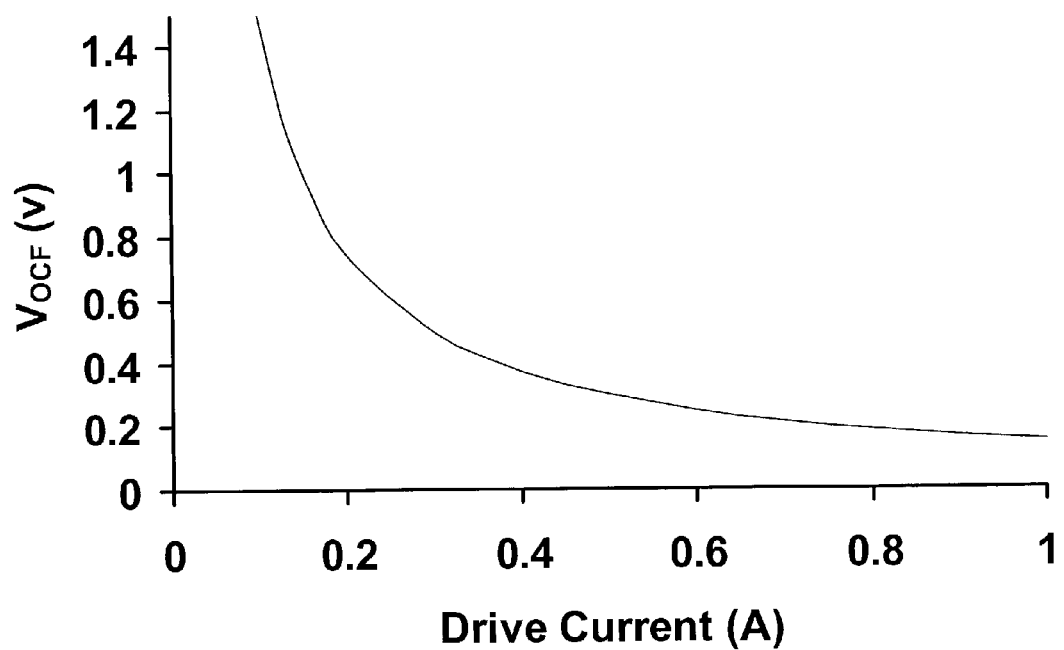
FIG. 8 plots of an example of the relationship between drive current and overhead voltage.

FIG. 8 is a typical plot of $V_{OCF}$ versus drive current that can be implemented by the overhead controller 72. FIG. 8 illustrates the case where overhead power dissipation is set to 0.15 W. The overhead controller 72 can implement other functional relationships between $V_{OCF}$ and the drive current depending on system requirements and characteristics.

Many variations and modifications can be made to the present invention without departing from its scope. For example, the comparator 66 can be either digital or analog comparator. The DC—DC converter 62 can receive either an analog or digital control signals. In addition, the overhead controller 72 can incorporate the functionality of the operational amplifier 64 and provide an output directly to the DC—DC controller 62. Many other variations, modifications, and combinations are taught and suggested by the present invention, and it is intended that the foregoing specification and the following claims cover such variations, modifications, and combinations.

The invention claimed is:

1. An optical source driver for driving an optical source, comprising:
   a current source series connected to the optical source;
   a DC—DC converter having a power input, a power output connected to an input of the optical source, and a control input;
   an operational amplifier having a first input connected between the optical source and the current source, a second input for receiving a first voltage, and an output connected to the control input of the DC—DC converter;
   a switch having a power input and having a power output connected to the input of the optical source; and
   a comparator having a first input connected between the optical source and the current source, a second input for receiving a second voltage, and an output connected to a control input of the switch.

2. The optical source driver of claim 1 wherein the current source receives a control signal to control the amount of current generated by the current source.

3. The optical source driver of claim 1 wherein a storage capacitor is connected to the output of the DC—DC converter.

4. The optical source driver of claim 1 wherein the first voltage is greater than a minimum voltage required to drive the current source.

5. The optical source driver of claim 4 wherein the second voltage is greater than a minimum voltage required to drive the current source but less than the first voltage.

6. An optical source driver for driving an optical source, comprising:
   a current source series connected to the optical source;
   a primary control loop having a DC—DC converter and an operational amplifier, wherein the DC—DC converter has a power input, a power output connected to the input of the optical source, and
   a control input, and wherein the operational amplifier has a first input connected between the optical source and the current source, a second input for receiving a first voltage, and an output connected to the control input of the DC—DC converter, for controlling the output of the DC—DC converter in response to a control signal at the second input; and
   an override control loop having a power input, a power output connected to an input of the optical source, a switch between the power input and the power output, and a comparator having a first input connected between the optical source and the current source, having a second input, and having an output connected to a control input of the switch, for selectively connecting the power input to the power output when a signal between the optical source and the current source falls below a predetermined point.

7. The optical source driver of claim 6 wherein the first voltage is greater than a minimum voltage required to drive the current source.

8. The optical source driver of claim 6 wherein the predetermined point is greater than where the current driver ceases to operate.

* * * * *